(12) United States Patent
Jia et al.

(10) Patent No.: US 10,559,650 B2
(45) Date of Patent: Feb. 11, 2020

(54) TRENCH CAPACITOR WITH WARPAGE REDUCTION

(71) Applicant: Texas Instruments Incorporated, Dallas, TX (US)

(72) Inventors: Jiao Jia, Chengdu (CN); Zhipeng Feng, Sichuan (CN); He Lin, Frisco, TX (US); Yunlong Liu, Chengdu (CN); Manoj Jain, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/028,862

(22) Filed: Jul. 6, 2018

(65) Prior Publication Data

US 2019/0229181 A1 Jul. 25, 2019

Related U.S. Application Data

(60) Provisional application No. 62/620,777, filed on Jan. 23, 2018.

(51) Int. Cl.
*H01L 49/02* (2006.01)
*H01L 21/306* (2006.01)
(Continued)

(52) U.S. Cl.
CPC .......... *H01L 28/60* (2013.01); *H01L 21/0257* (2013.01); *H01L 21/0262* (2013.01); *H01L 21/02164* (2013.01); *H01L 21/02236* (2013.01); *H01L 21/02532* (2013.01); *H01L 21/02595* (2013.01); *H01L 21/30604* (2013.01); *H01L 21/32055* (2013.01); *H01L 21/32134* (2013.01); *H01L 21/32139* (2013.01); *H01L 21/32155* (2013.01); *H01L 21/76831* (2013.01);
(Continued)

(58) Field of Classification Search
CPC ............... H01L 28/60; H01L 21/02164; H01L 21/02236; H01L 21/02532; H01L 21/0257; H01L 21/0262; H01L 21/30604; H01L 21/32055; H01L 21/32134; H01L 21/32139; H01L 21/32155; H01L 21/76831; H01L 21/02255; H01L 23/49503; H01L 23/49575; H01L 23/562; H01L 25/18; H01L 24/40; H01L 24/48; H01L 29/7802; H01L 2224/40245; H01L 2224/48106; H01L 2224/48247; H01L 2924/1205; H01L 2924/13091
USPC ....................................................... 257/532
See application file for complete search history.

(56) References Cited

U.S. PATENT DOCUMENTS 6,236,079 B1   5/2001  Nitayama et al.
2002/0016035 A1 2/2002 Wu et al.
(Continued)

OTHER PUBLICATIONS

PCT Search Report for Application No. PCT/US 2019/014521, dated Apr. 25, 2019.

*Primary Examiner* — Tong-Ho Kim
(74) *Attorney, Agent, or Firm* — Andrew R. Ralston; Charles A. Brill; Frank D. Cimino

(57) ABSTRACT

A trench capacitor includes a plurality of trenches in a doped semiconductor surface layer of a substrate. At least one dielectric layer lines a surface of the plurality of trenches. A second polysilicon layer that is doped is on a first polysilicon layer that is on the dielectric layer which fills the plurality of trenches. The second polysilicon layer has a higher doping level as compared to the first polysilicon layer.

20 Claims, 9 Drawing Sheets

(51) Int. Cl.
  *H01L 21/768* (2006.01)
  *H01L 21/02* (2006.01)
  *H01L 21/3215* (2006.01)
  *H01L 21/3213* (2006.01)
  *H01L 23/495* (2006.01)
  *H01L 23/00* (2006.01)
  *H01L 21/3205* (2006.01)
  *H01L 25/18* (2006.01)
  H01L 29/78 (2006.01)

(52) U.S. Cl.
  CPC .. *H01L 23/49503* (2013.01); *H01L 23/49575* (2013.01); *H01L 23/562* (2013.01); *H01L 25/18* (2013.01); H01L 21/02255 (2013.01); H01L 24/40 (2013.01); H01L 24/48 (2013.01); H01L 29/7802 (2013.01); H01L 2224/40245 (2013.01); H01L 2224/48106 (2013.01); H01L 2224/48247 (2013.01); H01L 2924/1205 (2013.01); H01L 2924/13091 (2013.01)

(56) References Cited

U.S. PATENT DOCUMENTS

| | | |
|---|---|---|
| 2003/0134468 A1 | 7/2003 | Wang et al. |
| 2007/0254430 A1* | 11/2007 | Cheng .................. A01N 25/08 438/243 |
| 2008/0048232 A1 | 2/2008 | Su et al. |
| 2014/0374880 A1* | 12/2014 | Chen ................ H01L 27/10829 257/532 |
| 2016/0149011 A1* | 5/2016 | Hu .......................... H01L 29/45 257/741 |
| 2018/0076277 A1 | 3/2018 | Hu et al. |

\* cited by examiner

TRENCH CAPACITOR WITH WARPAGE REDUCTION

CROSS REFERENCE TO RELATED APPLICATIONS

This application claims the benefit of Provisional Application Ser. No. 62/620,777 entitled "Method For High Density Deep Trench Capacitor Warpage Control" filed Jan. 23, 2018, which is herein incorporated by reference in its entirety.

FIELD

This Disclosure relates to integrated trench capacitors as well as semiconductor devices including packaged devices that include integrated trench capacitors.

BACKGROUND

Integrated trench capacitors are known for high density capacitor designs. Formation of an integrated trench capacitor generally involves forming a deep trench type structure in a highly doped silicon substrate, lining the sidewalls and bottom of the trench with at least one dielectric layer, usually silicon oxide, followed by polysilicon filling of the trench that is doped in-situ or after the deposition, and then patterning of the polysilicon layer.

SUMMARY

This Summary is provided to introduce a brief selection of disclosed concepts in a simplified form that are further described below in the Detailed Description including the drawings provided. This Summary is not intended to limit the claimed subject matter's scope.

Disclosed aspects include an integrated trench capacitor that include a plurality of trenches in a doped semiconductor surface layer of a substrate. At least one dielectric layer lines a bottom and sidewall surfaces of the trenches. A second polysilicon layer that is doped is on a first polysilicon layer that is on the dielectric layer which fills the plurality of trenches. The second polysilicon layer has a higher doping level as compared to the first polysilicon layer.

BRIEF DESCRIPTION OF THE DRAWINGS

Reference will now be made to the accompanying drawings, which are not necessarily drawn to scale, wherein.

DETAILED DESCRIPTION

Figure 1:
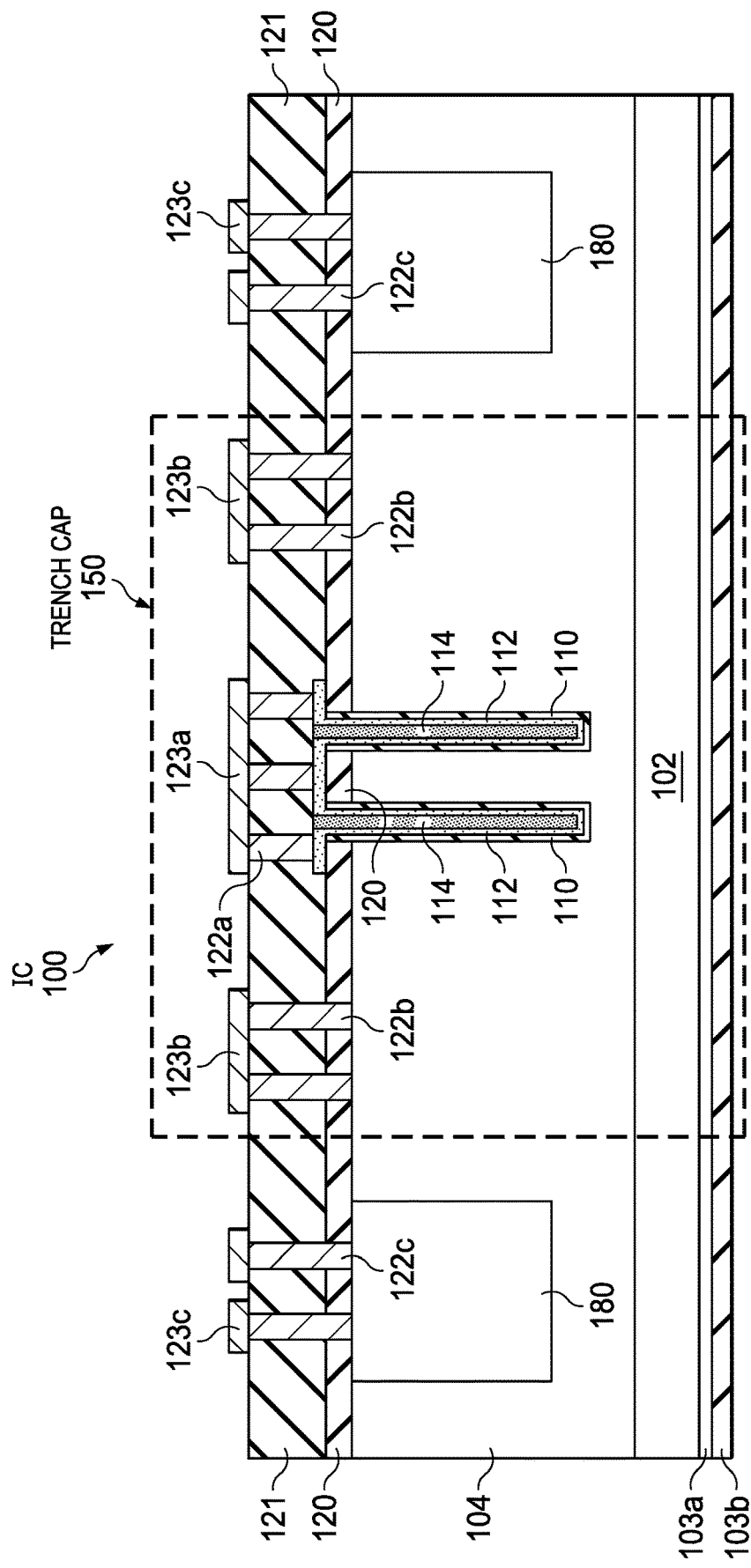
FIG. 1 is a cross sectional view of an example integrated circuit (IC) including a disclosed trench capacitor, according to an example aspect.

Example aspects are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this Disclosure.

Also, the terms "coupled to" or "couples with" (and the like) as used herein without further qualification are intended to describe either an indirect or direct electrical connection. Thus, if a first device "couples" to a second device, that connection can be through a direct electrical connection where there are only parasitics in the pathway, or through an indirect electrical connection via intervening items including other devices and connections. For indirect coupling, the intervening item generally does not modify the information of a signal but may adjust its current level, voltage level, and/or power level.

Disclosed aspects recognize for integrated trench capacitors in order to obtain a high density capacitor to generally provide a nF range capacitance, the integrated trench capacitor generally uses a high density deep trench process to increase the effective capacitor area, forming tens or hundreds of thousands of trenches that are generally 10 to 50 µm deep to provide a high capacitance, such as 10 to 50 nF. In order to provide a low equivalent series resistance (ESR), conventional integrated trench capacitors use a highly doped substrate, and a highly doped polysilicon layer to fill the trenches after dielectric lining of the trenches which functions as the top plate for the trench capacitor.

However, both the deep trench process and polysilicon fill process change the wafer stress distribution which makes the wafer warpage get worse. Post-doped polysilicon deposition for 200 mm diameter wafers having about 200,000 trenches about 27 µm deep on each die were found to suffer high warpage, with a warpage being over 400 µm. This high warpage resulted in the wafer being rejected by processing tools for subsequent processing such as the polysilicon dry etch tool, and not being able to move on for subsequent processing. The photolithography, etch and thin film tools each generally need the wafer warpage to be below 100 µm to operate properly.

FIG. 1 is a cross sectional view of an example IC 100 including a disclosed trench capacitor 150, according to an example aspect. Although shown on an IC 100, disclosed trench capacitors can also be stand-alone (discrete) capacitors including tens of thousands or hundreds of thousands of trenches that are generally 10 to 50 µm deep depending the need for capacitance density. IC 100 is shown including functional circuitry 180 shown simply as a block that includes metal 123b on filled vias 122b for node contact. The functional circuitry 180 comprises circuit elements (including transistors, and generally diodes, resistors, capacitors, etc.) generally formed in at least one epitaxial layer 104 on a bulk substrate (substrate) 102 configured together with the trench capacitor(s) for generally realizing at least circuit function. Example circuit functions include analog (e.g., amplifier, power converter or power FET), radio frequency (RF), digital, or non-volatile memory functions. The circuit function provided by the functional circuitry 180 can also be for providing a top side ground for the trench capacitor 150 so that the metal 123b and filled vias 122b shown in FIG. 1 would not be needed.

The substrate 102 and/or epitaxial layer(s) 104 can comprise silicon, silicon-germanium, or another semiconductor material. Although not shown, as known in the art, in the case of the IC the IC generally includes field oxide such as shallow trench isolating (STI) or Local oxidation of silicon (LOCOS) in the epitaxial layer 104 for isolating adjacent devices.

The epitaxial layer 104 can comprise a lightly doped p-type epitaxial layer that is grown on substrate 102 comprising a p+ substrate or a lightly doped n-type epitaxial layer that is grown on a substrate 102 comprising an n+ substrate. There can be multiple epitaxial layers with the same or different doping levels. There are also two layers shown on the bottom side of the substrate, shown as 103a and 103b, that can comprise a back side polysilicon layer and a silicon oxide layer respectively, which function as a sealant to prevent dopant from escaping from the bottom side of the substrate 102 which is highly doped that can cause cross contamination problems in processing equipment such as the gate oxide furnace that can be used to form the capacitor's dielectric layer.

The trench capacitor 150 includes a plurality of trenches formed entirely in the epitaxial layer 104. The trench depth is generally 10 to 50 µm, which is less than the thickness of the epitaxial layer 104. The epitaxial layer 104 has a lower doping level as compared to a doping level in the substrate 102. There is a dielectric layer 110 that can comprise the same thermally grown gate oxide layer for a metal-oxide-semiconductor (MOS) transistor on the IC that lines a surface of the plurality of trenches.

The thickness range for the dielectric layer 110 is generally 100 to 500 Å, which will generally depend on the need for capacitance density and the power requirement. A dielectric layer 110 with a dielectric constant different from silicon oxide can also be deposited. The trenches include a second polysilicon layer 114 that is doped on a first polysilicon layer 112 that is generally deposited undoped on the dielectric layer 110 that fills the plurality of trenches. The first polysilicon layer 112 generally receives doping from the second polysilicon layer 114 during all significant heat cycling. The first polysilicon layer 112 and second polysilicon layer 114 are both generally doped with a doping type that matches the doping in the epitaxial layer 104 and in the substrate 102.

It is possible for a metal liner of about 1 µm or less to be between the first polysilicon layer 112 and the dielectric layer 110. The second polysilicon layer 114 has a higher doping level as compared to the first polysilicon layer which is generally deposited undoped, but will generally receive doping from the second polysilicon layer 114 during significant thermal processing received during fabrication. The first polysilicon layer 112 thus generally has its highest doping concentration at an interface with the second polysilicon layer 114.

The trench capacitor 150 shown includes top side contact both the top plate and the bottom plate of the trench capacitor 150. The contact comprises metal on filled vias formed through a pre-metal dielectric (PMD) layer 121, comprising metal 123a on filled vias 122a (e.g., W filled) to the second polysilicon layer 114 to provide top plate contact, and metal 123b on filled vias 122b that though the epitaxial layer 104 provide bottom plate contact. The functional circuitry 180 also has metal 123c on filled vias 122c.

This trench capacitor contact arrangement is only one of at least two possible contact arrangements. A second trench capacitor contact arrangement has the top plate connected to the metal 123a as shown in FIG. 1, but the contact to the bottom plate involves removing (e.g., by wafer backgrinding) of layer 103b and 103a, and then depositing back side metal (BSM) to provide a solderable die attach metal stack to ensure good electrical contact to the back side of the chip (ohmic contact) or proper bonding of the chips to their mounting cases. The BSM layer can comprise gold or silver on titanium on nickel.

The aspect ratio (AR) for disclosed trench capacitors generally depend on the design need, but for a high density trench capacitor, the aspect ratio is in general over 10. For example, the AR value can be from 18 to 30.

Figure 2A:
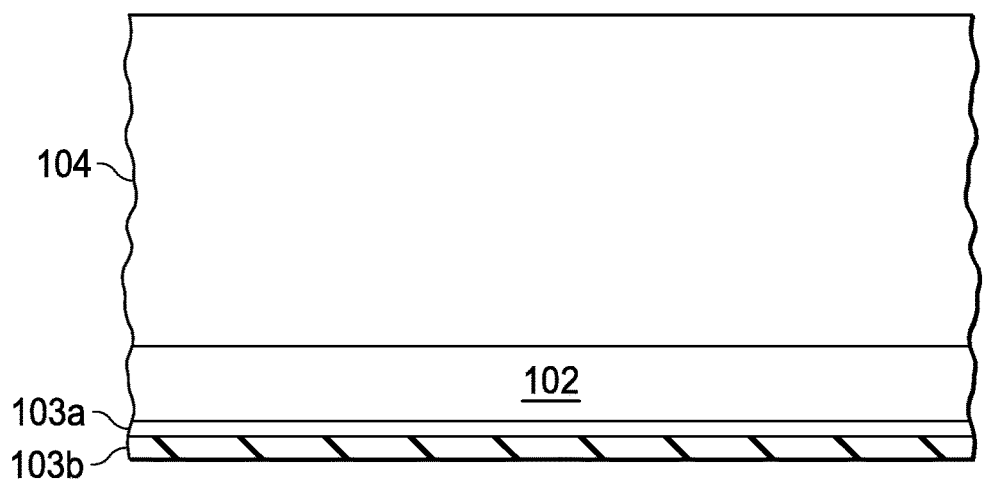
FIGS. 2A-2L are cross-sectional diagrams showing processing progression for an example method of forming an integrated trench capacitor, according to an example aspect.

FIGS. 2A-2L are cross-sectional diagrams showing processing progression for an example method of forming an integrated trench capacitor, according to an example aspect. FIG. 2A shows an epitaxial layer 104 on a substrate 102. On the bottom side of the substrate 102 there are layers comprising a back side polysilicon layer 103a with a silicon oxide layer 103b thereon that as described above are for sealing in dopant from otherwise escaping from the back side of the substrate 102.

Figure 2B:
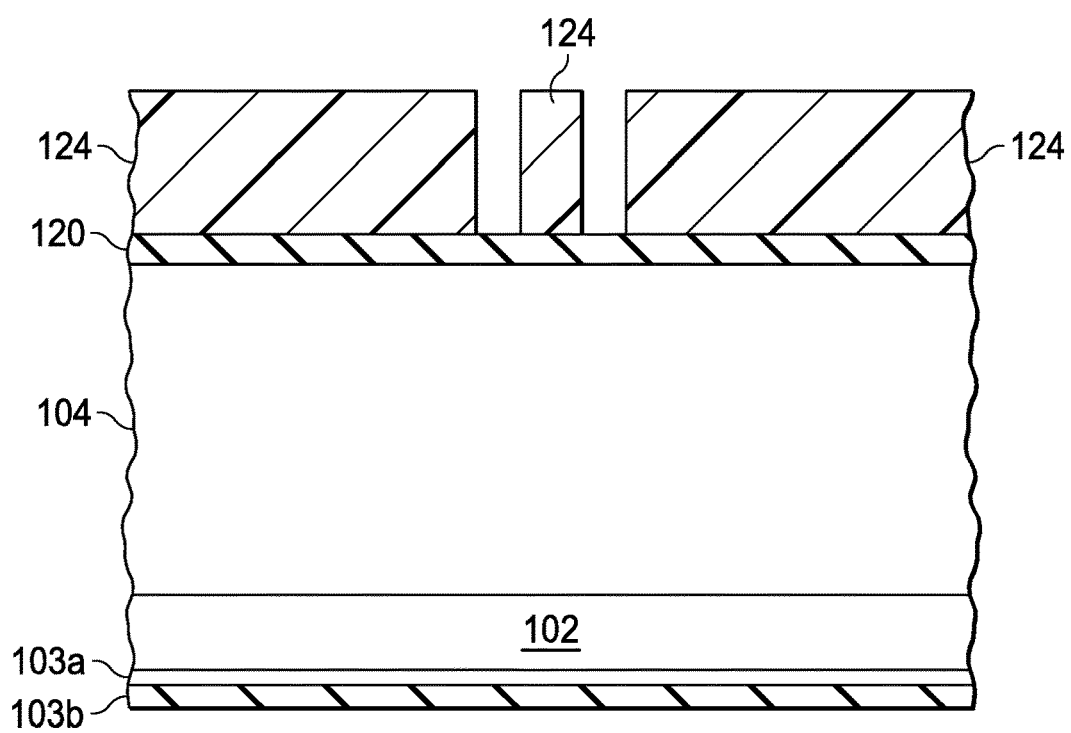

FIG. 2B shows an overlying photoresist layer 124 created and patterned so that trenches can be formed. For purposes of illustration, only two deep trenches are shown, but it is understood more than 2 trenches (such as tens of thousands or hundreds of thousands of trenches) are generally formed. The photoresist layer 124 overlies a dielectric layer 120 that is generally a silicon oxide layer 120 which protects the surface of the die. Although not shown, the photoresist layer 124 can be on top of a hardmask (HM) layer, such as a high-density plasma (HDP) oxide HM layer, that is formed on the dielectric layer 120. An oxide HM layer may be used when the photoresist layer 124 is thin or the trench is deep enough so that the photoresist layer 124 would be completely destroyed in the trench etching process.

Figure 2C:
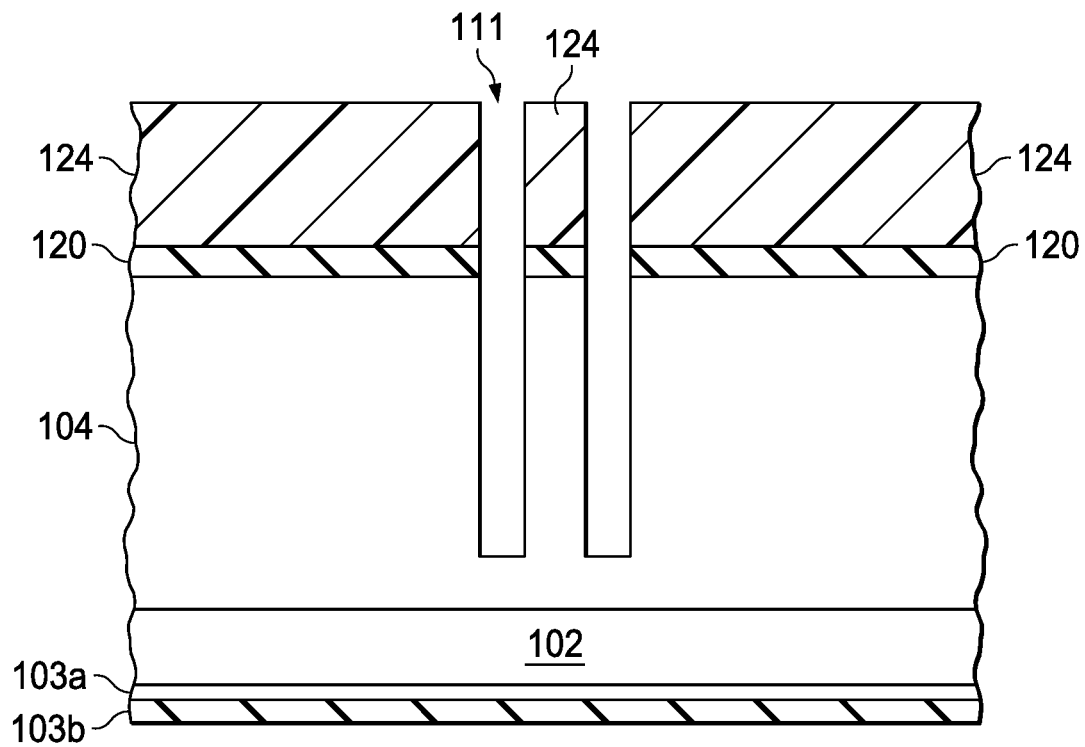

FIG. 2C shows the in-process trench capacitor after anisotropic etching is used to form deep trenches 111 through the oxide HM (if used), dielectric layer 120, and into the epitaxial layer 104, but not reaching the substrate 102. It will be understood that although photoresist layer 124 is shown here as remaining intact after the trench etching, much of the photoresist layer 124 may have been removed by the trench etch process.

In at least one aspect, a circular trench layout is used which eliminates sharp corners, and the width of the trenches is approximately 0.5 µm to 3 µm and the trenches are spaced apart approximately 0.3 µm to 1.5 µm. The depth of the trench 111 can, of course, be deeper or shallower as needed by the application and to fit within the parameters of the process into which the capacitor is being integrated, such as the thickness of the epitaxial layer 104 and the drive conditions for any wells. The photoresist layer 124 is then removed and the wafer is cleaned.

Figure 2D:
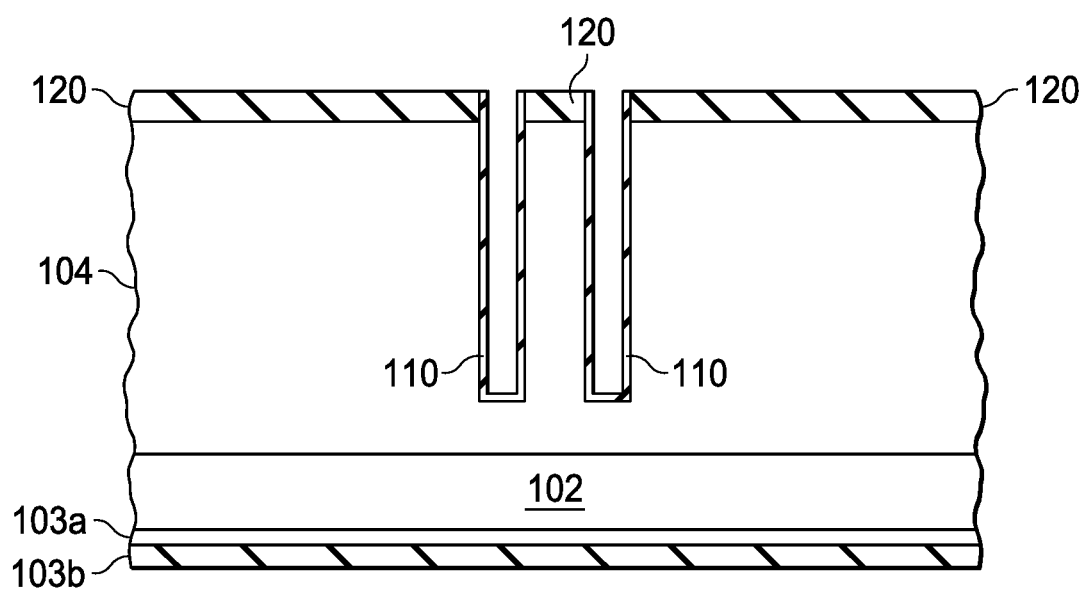

As seen in FIG. 2D, a dielectric layer 110 is grown or deposited on the sidewalls and the bottom of the trenches 111. In one aspect, the dielectric layer 110 is entirely a silicon oxide. The silicon oxide layer can be, for example, 200 Å to 2,000 Å thick, such as 500 Å thick for an intended operating voltage of 13.2 V. As noted above, the dielectric layer 110 may also be deposited. In one particular aspect, the dielectric layer 110 comprises an Oxide-Nitride-Oxide (ONO) layer stack.

Figure 2E:
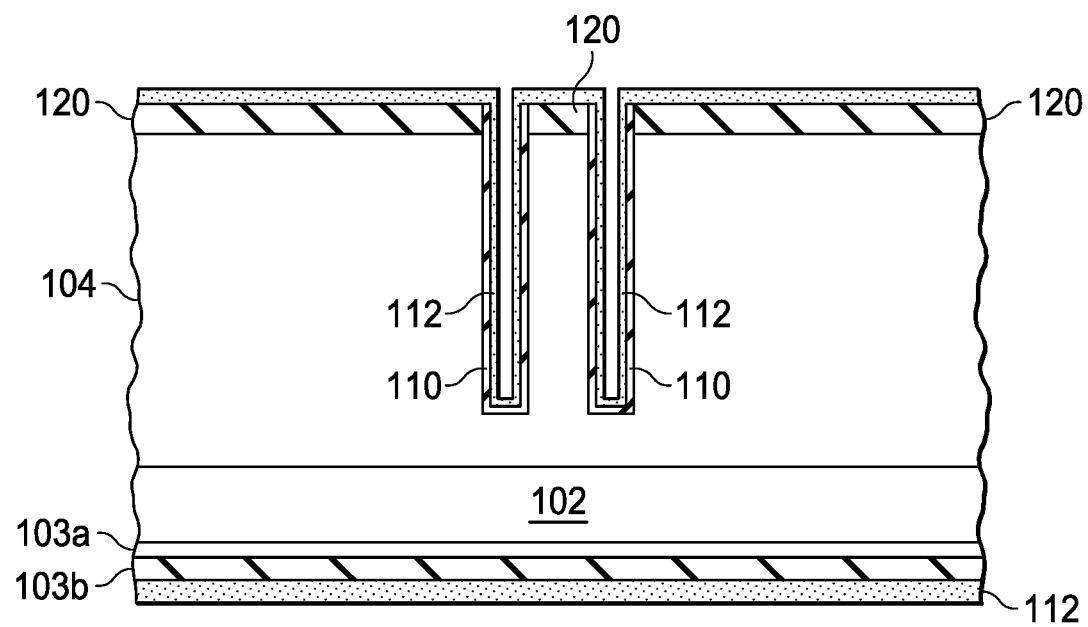
Figure 2F:
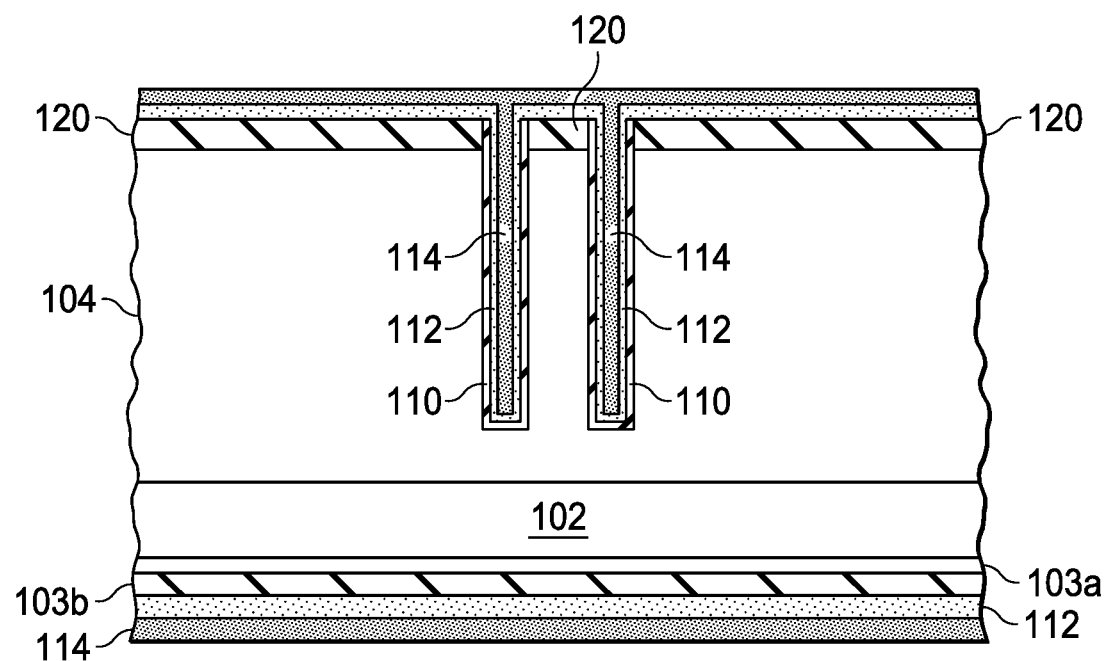

As shown in FIG. 2E, an undoped polysilicon layer as the first polysilicon layer 112 is then deposited, generally by a low pressure chemical vapor deposition (LPCVD) process to partially fill the trenches 111 with a thickness significantly less than ½ the width of the trenches to avoid filling the trenches. As shown in the in-process trench capacitor in FIG. 2F, at least one doped polysilicon layer as the second polysilicon layer 114 is then deposited on the undoped polysilicon layer as the first polysilicon layer 112, again generally by an LPCVD process to partially completely fill and overfill the trenches 111.

The second polysilicon layer 114 can comprise in-situ doped layer (p+ polysilicon for a p-type epitaxial layer as the epitaxial layer 104 and p-type substrate as the substrate 102, and n+ polysilicon for an n-type epitaxial layer as the epitaxial layer 104 and n-type substrate as the substrate 102) or be furnace doped, generally deposited to a thickness between 0.8 µm to 1.1 µm and having a doping level of $5 \times 10^{18}/cm^3$ to $1 \times 10^{20}/cm^3$. The doped polysilicon layer is deposited to completely fill and overfill the trenches. In the final capacitor the first polysilicon layer 112 is generally a compressive stress layer and the second polysilicon layer 114 being a relatively highly doped polysilicon layer is generally a tensile stress layer.

Figure 2G:
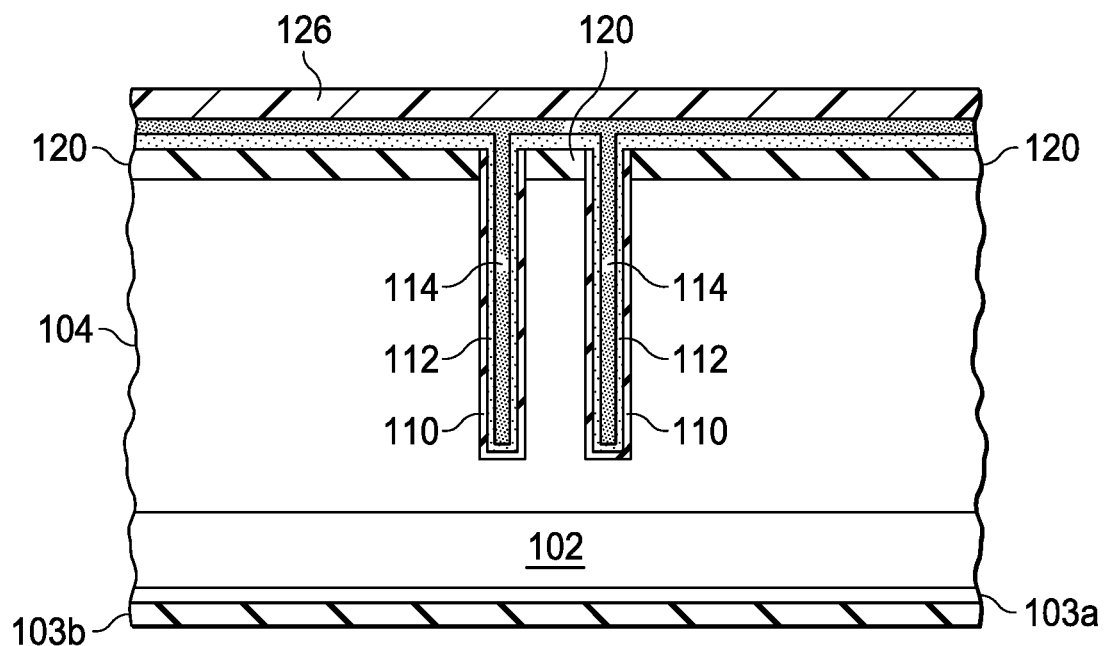

Optionally, after forming the doped polysilicon layer, such as doping using a furnace doping process, the first polysilicon layer 112 and the second polysilicon layer 114 are generally removed from the back side of the substrate 102, such as with a wet etch process. After the back side polysilicon removal, a dielectric capping layer can then be deposited. The resulting in-process trench capacitor is shown in FIG. 2G with the dielectric capping layer thereon shown as 126. The capping layer 126 is generally 600 Å to 1000 Å, which can be a tetraethoxysilane (TEOS)-derived oxide layer deposited at around 680° C., although other low stress capping layer films can also be used. After depositing the capping layer 126, a furnace annealing process can be performed, such as with a time range of 10 to 30 minutes at a temperature of 900° C. to 1050° C. A rapid thermal anneal may also be used. This optional additional anneal helps relax (reduce) the wafer warpage before polysilicon etch, and can also reduce the ESR because the second polysilicon layer 114 diffuses into the first polysilicon layer 112.

Figure 2H:
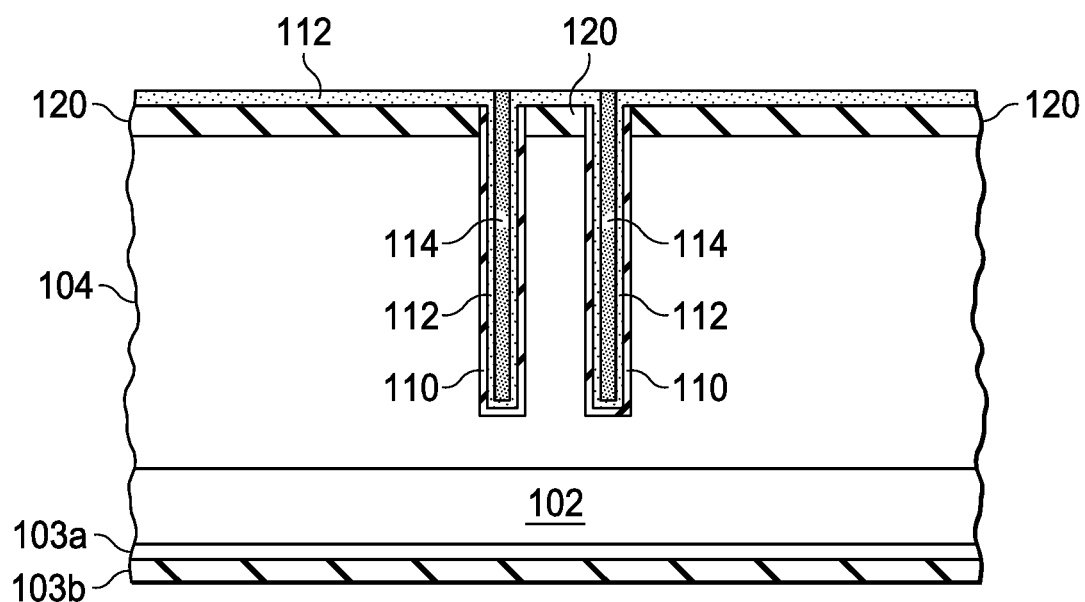

Disclosed aspects balance the total stress by process loop, especially for the trench polysilicon loop by changing the trench gap fill film stack to the first polysilicon layer 112 which is generally a compressive stress layer on the bottom of the trench, a wafer back side film stack 103b on 103a, add an additional capping layer anneal to relax the warpage, which generally reduces the wafer warpage for 300 mm wafers before polysilicon etch from about 400 µm to less than 100 µm as described in the Examples below. After the annealing process, the dielectric capping layer 126 is removed, and then optionally a partial front side polysilicon etch (e.g., etching about 60% of overall polysilicon layer 114/112 thickness) can be used that generally comprises a blanket dry etch. The partial polysilicon etch can reduce the cell and scribe line area film step height, and facilitate the following photolithography process. The resulting in-process trench capacitor after the dielectric capping layer 126 removal and partial front side polysilicon etch is shown in FIG. 2H, where the full thickness of the second polysilicon layer 114 lateral to the trenches is shown completely removed.

Figure 2I:
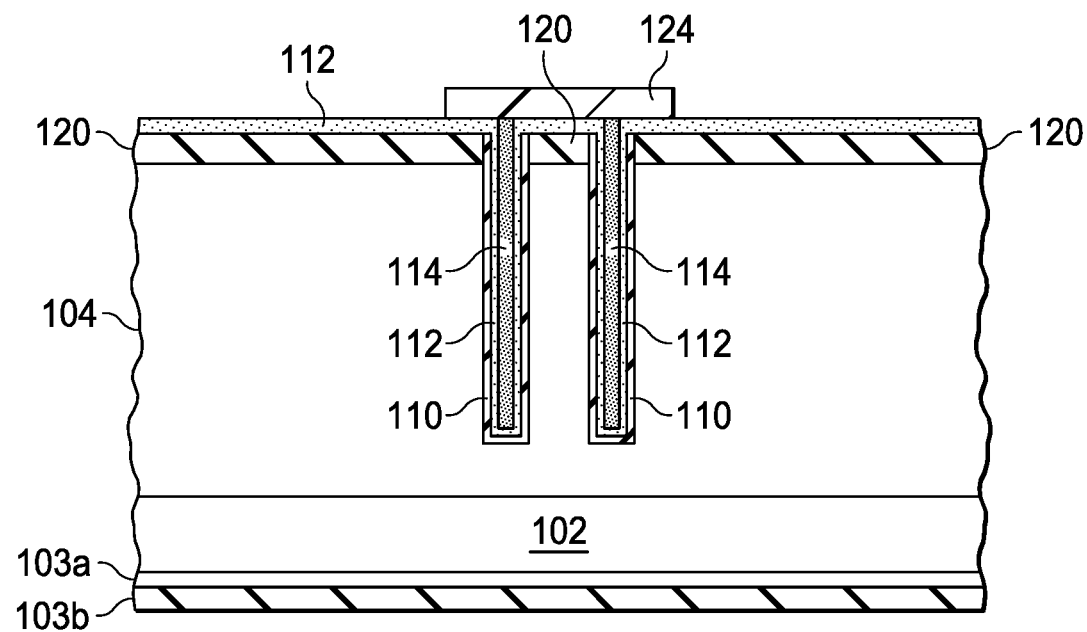
Figure 2J:
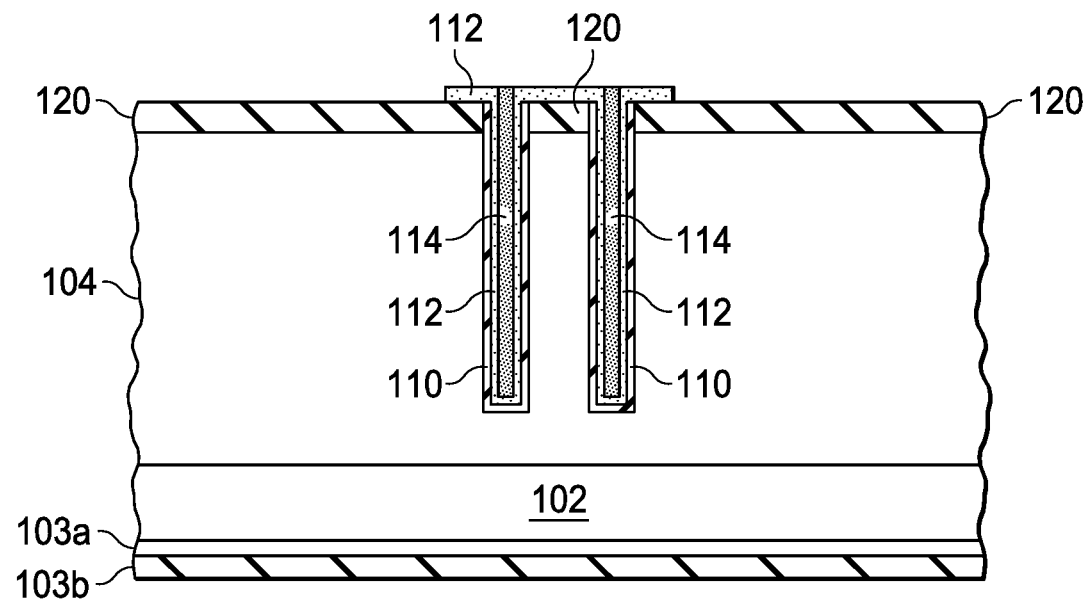

As shown in the in-process trench capacitor in FIG. 2I, an overlying photoresist layer 124 is created and patterned so that the polysilicon layers can be patterned, shown only patterning the second polysilicon layer 114 because of the above described partial front side polysilicon etching. FIG. 2J shows the in-process trench capacitor after patterning of the second polysilicon layer 114.

Figure 2K:
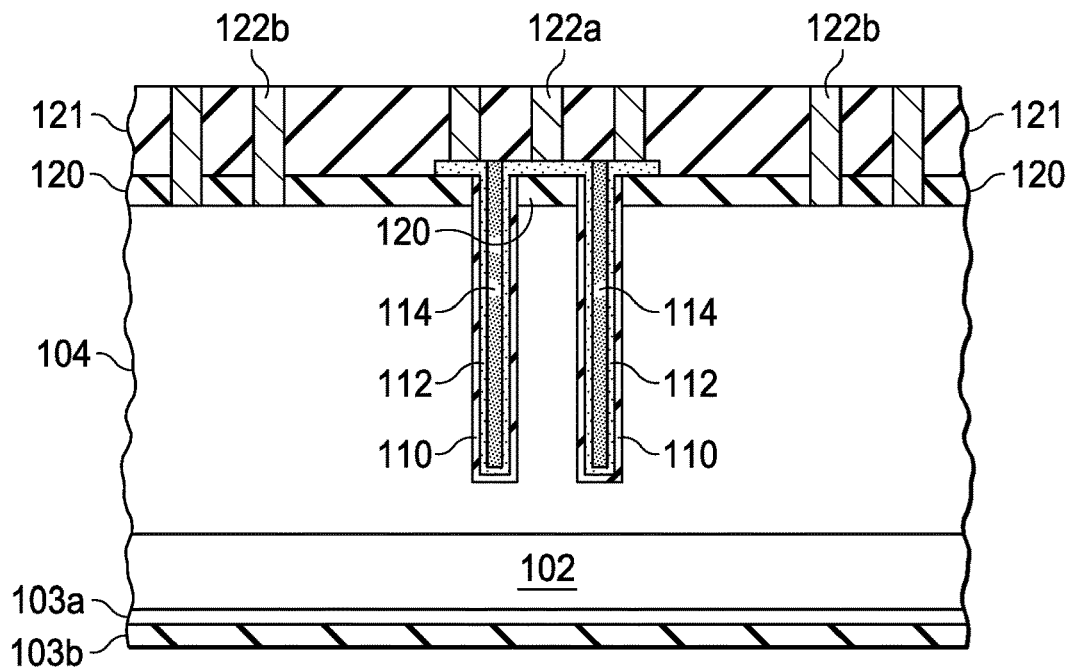

FIG. 2K shows the in-process trench capacitor after depositing a PMD layer 121 on the patterned polysilicon layers and the dielectric layer 120 lateral to the patterned polysilicon layers. The PMD layer 121 can comprise TEOS-derived silicon oxide layer. A TEOS deposition for a non-plasma deposition process can comprise LPCVD at a pressure of about 300 mTorr and at a temperature of about 700° C. However, other dielectric layers can also be used including deposited silicon oxides, such as comprising an organo-silicate glass (OSG), a low-k dielectric (i.e., a smaller dielectric constant relative to silicon dioxide), a doped dielectric layer such as a fluorine-doped silica glass (FSG), or a SiN layer or its variants (e.g., SiON). The thickness range for the PMD layer 121 is generally from 6,000 Å to 8,000 Å.

Figure 2L:
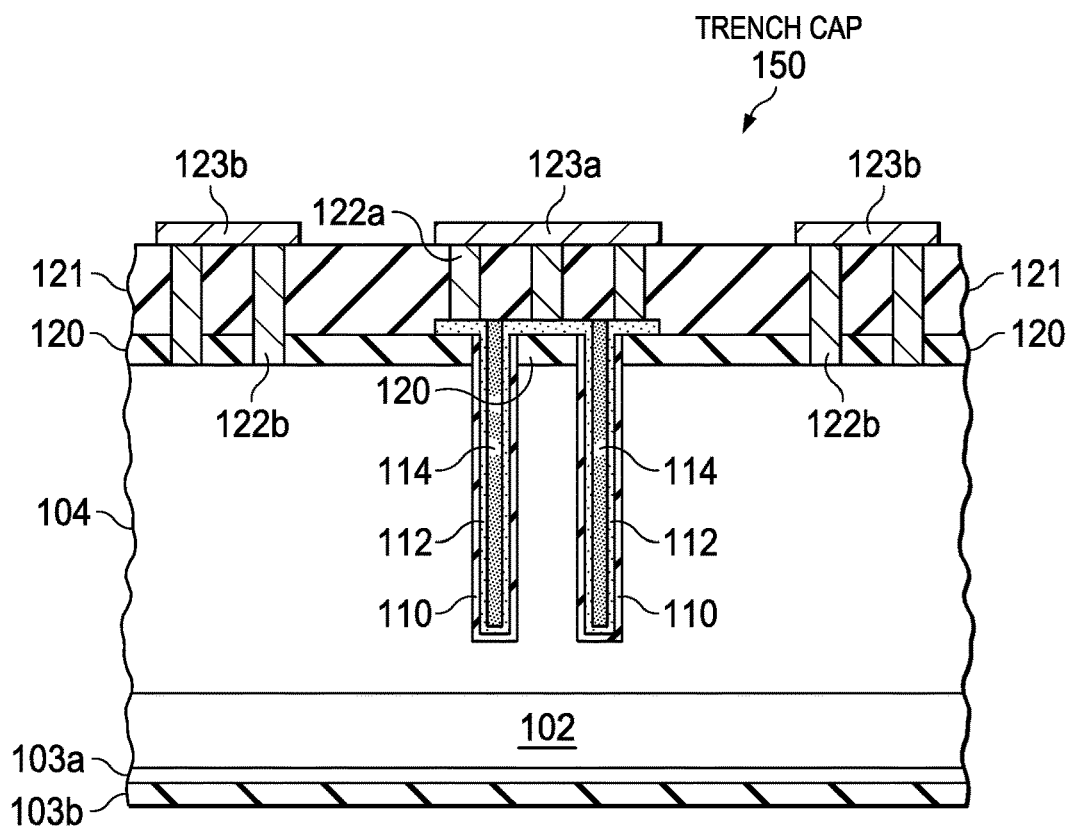

FIG. 2L shows the in-process trench capacitor after forming filled contact vias in the PMD layer 121, then depositing a metal layer over the PMD layer 121, and then patterning the metal layer to form metal 123a over filled vias 122a over the second polysilicon layer 114 to contact the top plate of the trench capacitor, and metal 123b over filled vias 122b to the epitaxial layer 104 to provide contact to the bottom plate of the capacitor. The metal layer can comprise AlCu, typically with 0.5 to 4 wt. % Cu. Alternatively, the metal layer can comprise only copper in which case a damascene process is generally performed. One or more metal levels may follow, followed by passivation processing to expose bond pads in the top metal layer.

Figure 3A:
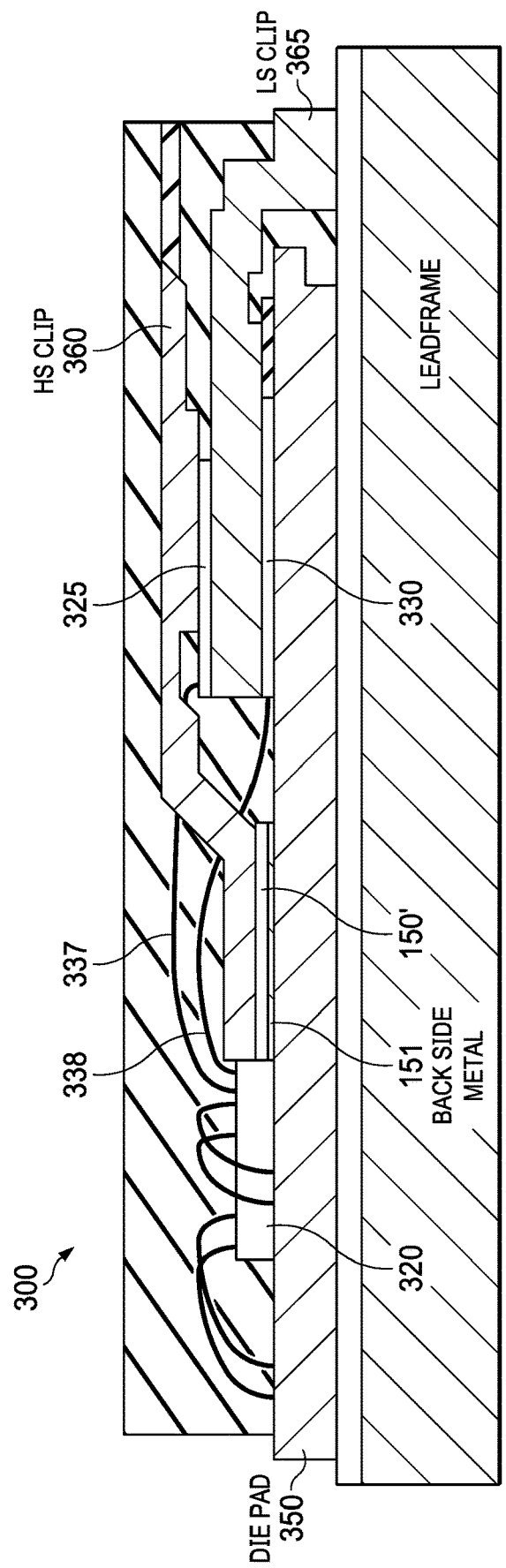
FIG. 3A shows an example packaged device comprising a synchronous buck converter including a disclosed trench capacitor in a package along with a controller IC and stacked vertical field effect transistors (FETs), all shown on a common die pad.

FIG. 3A shows an example packaged device 300 comprising an example synchronous buck converter including a disclosed trench capacitor shown as 150' in a package along with a controller IC 320 that generally also includes integrated gate drivers, and stacked vertical FETs including a stacked high-side (HS) vertical FET 325 on a low-side (LS) vertical FET 330 all on die pad 350 of a lead frame. The trench capacitor 150' is shown including a back side metal (BSM) layer 151 that provides bottom plate contact which is an alternative to the front side bottom plate contact provided by the metal 123b over filled vias 122b for the trench capacitor 150. Otherwise the trench capacitor 150' is the same structures as the trench capacitor 150 shown in FIG. 1 and in FIG. 2L.

There are metal clips shown including a HS clip 360 on the HS vertical FET 325 and a LS clip 365 between the HS FET 325 and the LS FET 330. The high-current VIN (high-side FET 325 drain) and voltage switching (VSW) connections use clip-bonding technology, which replaces the wire-bond connection generally with a solid copper bridge. This arrangement substantially reduces the on-resistance $R_{DS}$ (ON) and conduction losses compared to wire bonding, and generally provides excellent thermal performance.

The trench capacitor 150 is lateral to the FET stack and the controller IC 320 on the same die pad 350. The bond wires shown include bond wires 337 and 338 from the controller IC 320 to bond pads that coupled to respective gates of the HS FET 325 and LS FET 330. In a synchronous buck converter such as packaged device 300, the FET's 325 and 330 vertical current flow makes it ideal for stacking. For NMOS FETs the HS FET 325 source terminal is located directly above the LS FET 330 drain terminal, virtually eliminating resistance and parasitic inductance between these devices that enables faster switching. In addition, the LS FET 330 source terminal is at ground potential, and with a suitable BSM layer can be soldered directly to the exposed pad of the package for highly efficient heat transfer.

Figure 3B:
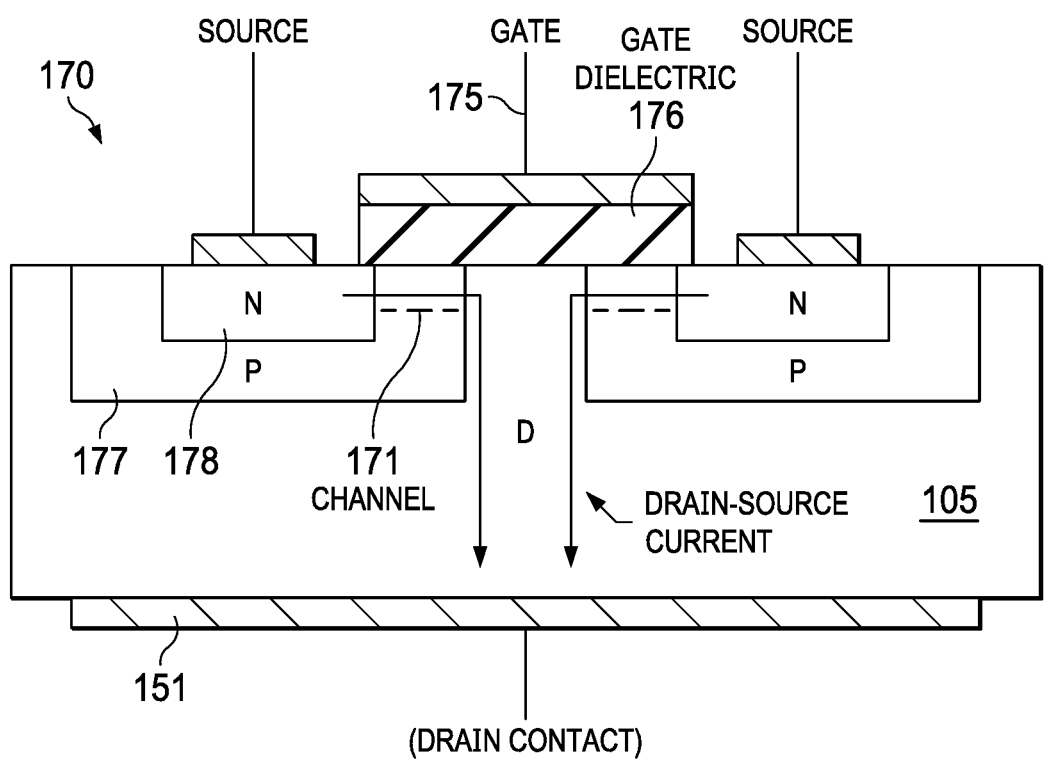
FIG. 3B shows an example simplified example vertical metal oxide semiconductor FET (MOSFET) shown as a cross section depiction that can be used for the FET in disclosed packaged devices.

FIG. 3B shows a simplified example vertical MOSFET 170 shown as a cross section depiction that can be used for the MOSFET in disclosed packaged devices. Although shown as a planar gate device, trench gate MOSFETs may also be used. The actual structures of a real power MOSFET is generally more complex and includes a variety of other structures including trenches, such as for the gate or for field plates. The vertical MOSFET 170 includes an N+ source 178 formed in a pwell 177 that is formed in a substrate 105.

The drain for the MOSFET device 170 shown as D is from the center region under the gate electrode 175 on a gate dielectric 176 to the bottom of the die having a BSM layer 151 thereon. The channel 171 shown is horizontal under the gate electrode 175 on gate dielectric 176, but it is shorter as compared to a conventional MOSFET, and the current flow shown between channel 171 and the drain contact at the BSM layer 151 is vertical. The short channel 171 provided means a low ON resistance, a property of power devices.

Disclosed aspects as described above overcome the high wafer warpage for integrate trench capacitors was caused by conventional trench and trench gap fill process. The deeper the trench and the higher trench density, the higher the induced higher wafer warpage. The conventional solution for warpage reduction is to reduce the trench depth and trench density. The key figure of merit (FOM) for a high density trench capacitor is high capacitance density. The capacitance density depends on the trench depth and trench density.

Deeper trench and higher trench density can improve capacitance density. Disclosed methodology includes using the stress properties of undoped and doped polysilicon to compensate the film stress which can keep the trench depth and trench density high while reducing the warpage. The doped polysilicon is a tensile stress layer while the undoped polysilicon layer at the bottom of the trenches is a compressive stress layer that together can balance the wafer warpage. The as-deposited undoped polysilicon layer as the bottom most polysilicon layer can help avoid tool contamination.

Another key FOM for a high density capacitor is low ESR, where the polysilicon layer works as top plate and lower polysilicon resistance is helpful for low ESR. The additional anneal before polysilicon etch as described above can make diffusion from doped polysilicon to undoped polysilicon to reduce the undoped polysilicon resistance, at same time can also reduce the wafer warpage.

Disclosed trench capacitors can be packaged with IC chips as their input and output filtering network, or as a discrete high density capacitor. The semiconductor die with disclosed trench capacitors may include various elements therein and/or layers thereon, including barrier layers, dielectric layers, device structures, active elements and passive elements including source regions, drain regions, bit lines, bases, emitters, collectors, conductive lines, conductive vias, etc. Moreover, the semiconductor die can be formed from a variety of processes including bipolar, Insulated Gate Bipolar Transistor (IGBT), CMOS, BiCMOS and MEMS.

Those skilled in the art to which this Disclosure relates will appreciate that many other aspects are possible within the scope of the claimed invention, and further additions, deletions, substitutions and modifications may be made to the described aspects without departing from the scope of this Disclosure.

The invention claimed is:

1. A method for forming a trench capacitor, comprising:
   forming a plurality of trenches in a doped semiconductor surface layer of a substrate;
   forming a dielectric layer that lines a surface of the plurality of trenches;
   depositing a first polysilicon layer that is undoped on the dielectric layer;
   depositing a second polysilicon layer on the first undoped polysilicon layer to fill the plurality of deep trenches;
   doping the second polysilicon layer;
   top side polysilicon etching using a masking layer pattern to etch back the first polysilicon layer in regions lateral to the plurality of trenches; and
   further comprising after the depositing the second polysilicon layer removing the first polysilicon layer and the second polysilicon layer from a back side of the substrate.

2. The method of claim 1, wherein both the depositing the second polysilicon layer and the doping of the second polysilicon layer are provided in an in-situ doped polysilicon deposition process.

3. The method of claim 1, wherein forming the dielectric layer comprises growing a thermal oxide layer.

4. The method of claim 1, further comprising after the removing the first polysilicon layer and the second polysilicon layer from a back side of the substrate, depositing a dielectric capping layer over the back side of the substrate, annealing the first and second polysilicon layers at a temperature in a range between 900° C. and 1050° C., removing the dielectric capping layer, and partial top side etching of the second polysilicon layer on the first polysilicon layer before the top side polysilicon etching.

5. The method of claim 1, wherein the doped semiconductor surface layer is part of a bulk substrate material that includes a plurality of the trench capacitors.

6. The method of claim 1, further comprising depositing a back side metal layer on the back side of the substrate.

7. The method of claim 1, wherein a depth of the plurality of trenches is 10 to 50 µm.

8. A method for forming a trench capacitor, comprising:
   forming a plurality of trenches in a doped semiconductor surface layer of a substrate;
   forming a dielectric layer that lines a surface of the plurality of trenches;
   depositing a first polysilicon layer that is undoped on the dielectric layer;
   depositing a second polysilicon layer over the first undoped polysilicon layer to fill the plurality of deep trenches;
   doping the second polysilicon layer; and
   top side polysilicon etching using a masking layer pattern to etch back the first polysilicon layer in regions lateral to the plurality of trenches.

9. The method of claim 8, wherein both the depositing the second polysilicon layer and the doping of the second polysilicon layer are provided in an in-situ doped polysilicon deposition process.

10. The method of claim 8, wherein forming the dielectric layer comprises growing a thermal oxide layer.

11. The method of claim 8, further comprising after the depositing the second polysilicon layer removing the first polysilicon layer and the second polysilicon layer from a back side of the substrate.

12. The method of claim 11, further comprising after the removing the first polysilicon layer and the second polysilicon layer from a back side of the substrate, depositing a dielectric capping layer over the back side of the substrate, annealing the first and second polysilicon layers at a temperature in a range between about 900° C. and about 1050° C., removing the dielectric capping layer, and partial top side etching of the second polysilicon layer on the first polysilicon layer before the top side polysilicon etching.

13. The method of claim 11, further comprising depositing a back side metal layer on the back side of the substrate after the removing.

14. The method of claim 8, wherein a depth of the plurality of trenches is within a range between about 10 µm and about 50 µm.

15. A method for forming a trench capacitor, comprising:
forming a plurality of trenches in a doped semiconductor surface layer of a substrate;
forming a dielectric layer that lines a surface of the plurality of trenches;
forming an undoped first polysilicon layer over the dielectric layer and over a back side of the substrate;
forming a doped second polysilicon layer over the undoped first polysilicon layer within the trenches and over the back side of the substrate;
removing the first and second polysilicon layers from over the surface layer, leaving a remaining portion of the second polysilicon layer within each trench and a remaining portion of the first polysilicon layer that electrically connects the remaining portions of the second polysilicon layer within the trenches; and
removing the first and second polysilicon layers from over the substrate back side.

16. The method of claim 15, wherein the first polysilicon layer is undoped when the second polysilicon layer is formed, and further comprising doping the second polysilicon layer.

17. The method of claim 16, wherein the second polysilicon layer is doped in-situ during formation.

18. The method of claim 15, further comprising forming a silicon oxide cap layer over the back side after removing the first and second polysilicon layers from over the substrate back side.

19. The method of claim 18, further comprising thermally annealing the first polysilicon layer and the second polysilicon layer after forming the cap layer.

20. The method of claim 18, further comprising forming a first metallic connection to the remaining portion of the first polysilicon layer, and forming a second metallic connection to the doped semiconductor surface layer.

* * * * *